(12) United States Patent
Ferreira

(10) Patent No.: US 8,823,107 B2
(45) Date of Patent: Sep. 2, 2014

(54) METHOD FOR PROTECTING THE GATE OF A TRANSISTOR AND CORRESPONDING INTEGRATED CIRCUIT

(75) Inventor: Paul Ferreira, Barraux (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 336 days.

(21) Appl. No.: 12/944,115

(22) Filed: Nov. 11, 2010

(65) Prior Publication Data

US 2011/0057264 A1    Mar. 10, 2011

Related U.S. Application Data

(62) Division of application No. 11/510,115, filed on Aug. 25, 2006, now Pat. No. 7,838,407.

(30) Foreign Application Priority Data

Aug. 29, 2005    (FR) ...................................... 05 08835

(51) Int. Cl.
*H01L 27/092*    (2006.01)
*H01L 29/772*    (2006.01)
*H01L 21/768*    (2006.01)
*H01L 29/66*    (2006.01)

(52) U.S. Cl.
CPC .... *H01L 21/76897* (2013.01); *H01L 21/76801* (2013.01); *H01L 29/665* (2013.01)
USPC .......................................... 257/368; 257/410

(58) Field of Classification Search
USPC .................................... 257/368, 410, E21.641
See application file for complete search history.

(56) References Cited

U.S. PATENT DOCUMENTS

| 5,384,287 | A | 1/1995 | Fukase et al. |
| 5,710,073 | A | 1/1998 | Jeng et al. |
| 5,904,521 | A * | 5/1999 | Jeng et al. ...................... 438/253 |
| 6,359,295 | B2 * | 3/2002 | Lee et al. ...................... 257/295 |
| 6,689,655 | B2 | 2/2004 | Coronel et al. |
| 6,833,575 | B2 | 12/2004 | Parekh et al. |
| 7,598,557 | B2 * | 10/2009 | Nagai et al. ................... 257/296 |
| 2003/0130439 | A1 | 7/2003 | Clough et al. |
| 2004/0067629 | A1 | 4/2004 | Beaman |
| 2005/0032314 | A1 | 2/2005 | Parekh et al. |
| 2005/0287759 | A1 * | 12/2005 | Wang et al. ................... 438/400 |

OTHER PUBLICATIONS

Preliminary French Search Report, FR 05 08835, dated Jun. 1, 2006.

* cited by examiner

*Primary Examiner* — Cuong Q Nguyen
(74) *Attorney, Agent, or Firm* — Gardere Wynne Sewell LLP

(57) ABSTRACT

A gate of a transistor in an integrated circuit is protected against the production of an interconnection terminal for a source/drain region. The transistor includes a substrate, at least one active zone formed in the substrate, at least one insulating zone formed in the substrate and a gate, the gate being formed above an active zone. A dielectric layer is formed on the transistor, the dielectric layer covering the gate. The dielectric layer is then etched while leaving it remaining at least on the gate so that the gate is electrically insulated from other elements formed above the dielectric layer. This etching is preferably carried out using a mask which was used for fabricating the gate and a mask which was used for fabricating the insulating zone.

20 Claims, 14 Drawing Sheets

METHOD FOR PROTECTING THE GATE OF A TRANSISTOR AND CORRESPONDING INTEGRATED CIRCUIT

PRIORITY CLAIM

The present application is a divisional application of U.S. application for patent Ser. No. 11/510,115 filed Aug. 25, 2006 (now U.S. Pat. No. 7,838,407 issued Nov. 23, 2010), which claims priority from French Application for Patent No. 05 08835 filed Aug. 29, 2005, the disclosures of which are hereby incorporated by reference.

BACKGROUND OF THE INVENTION

1. Technical Field of the Invention

The present invention relates to the field of integrated circuits provided with an extremely dense interconnection architecture making it possible to increase density on the scale of the elementary cell of an integrated circuit, for example a memory cell of the DRAM or SRAM type.

2. Description of Related Art

U.S. Pat. No. 6,689,655, the disclosure of which is incorporated by reference, describes a method for protecting the gate of a transistor in an integrated circuit, the purpose of which is to produce a connection terminal straddling a transistor gate and the silicon substrate while being insulated from the gate by a nitride layer etched selectively outside the gate zone, so that the connection terminal is in contact with the substrate. The selective etching is obtained by means of a doped polysilicon layer which subsequently is partially etched then insulated by a nitride plug.

The method is relatively complex and difficult to implement. Furthermore, it has been noted that the dopant species implanted in the polysilicon presents a non-negligible risk of diffusion towards other layers.

A need accordingly exists to overcome the drawbacks mentioned above.

More particularly, a need exists to simplify and make more economical the fabrication of a very high-density integrated circuit.

SUMMARY OF THE INVENTION

In an embodiment, a method is provided which protects the gate of a transistor in an integrated circuit during the production of an interconnection terminal. The transistor comprises a substrate, at least one active zone formed in the substrate, at least one insulating zone formed in the substrate and a gate, the gate being formed above an active zone.

The method comprises: forming a dielectric layer on the transistor, the dielectric layer covering the gate; etching the dielectric layer while leaving it remaining at least on the gate so that the gate is electrically insulated from other elements formed above the dielectric layer, wherein the etching is carried out by means of a mask used for fabricating the gate and by means of a mask used for fabricating the insulating zone.

A dielectric layer is formed by economical means already employed for fabricating the transistor. The gate may comprise a lower part and an upper part comprising metal silicide.

In one embodiment, the mask used for fabricating the gate and the mask used for fabricating the insulating zone are combined prior to the etching. One exposure step is sufficient to define the parts to be etched.

In another embodiment, the mask used for fabricating the gate and the mask used for fabricating the insulating zone are employed successively. A part corresponding to a gate formed on an active zone may thus be exposed more weakly in order to widen the dielectric layer.

In one embodiment, the dielectric layer comprises two superimposed sublayers. The dielectric layer may comprise a sublayer based on aluminum oxide and a sublayer based on silicon nitride.

In another embodiment, the dielectric layer comprises a layer based on aluminum oxide.

The layer based on aluminum oxide may be formed by atomic deposition. The layer based on aluminum oxide may be etched selectively with respect to the substrate, and the layer based on silicon nitride may be etched selectively with respect to the layer based on aluminum oxide. The layer based on silicon nitride may be used as a stop during the etching of an $SiO_2$ layer formed at a higher level. The layer based on aluminum oxide may be etched by a wet method with dilute HF. The layer based on silicon nitride may be etched by a dry method.

In one embodiment, an interconnection terminal is formed above an active zone and partially above the gate. The interconnection terminal remains insulated from the gate by the dielectric layer.

In another embodiment, the formation of the dielectric layer comprises conformal deposition of at least one layer which can be etched selectively with respect to the substrate. The layer may thus be removed from above the substrate.

In one embodiment, the partial removal of the dielectric layer comprises deposition of a resin layer, exposure of the resin layer outside the gate, development of the exposed parts of the resin layer, removal of the uncovered part of the dielectric layer and removal of the rest of the resin layer. A filling layer is deposited before the deposition of a resin layer, and the uncovered part of the filling layer is removed between the development of the exposed parts of the resin layer and the removal of the uncovered part of the dielectric layer.

The filling layer may comprise amorphous carbon, particularly when the dielectric layer comprises a single layer of aluminum oxide. The filling layer may comprise a material of the anti-reflective type known by the name "BARC".

The integrated circuit comprises a transistor formed in a substrate and provided with at least one insulating zone. The transistor comprises at least one active zone formed in the substrate, a gate above an active zone and a dielectric layer comprising aluminum oxide covering at least the gate, so that the gate is electrically insulated from other elements formed above the dielectric layer.

This benefits from excellent selectivity when etching the dielectric layer with respect to the substrate, which facilitates the use of pre-existing masks.

The gate may comprise a lower part and an upper part comprising metal silicide, for example $CoSi_2$. The metal silicide is at a distance from the layer of silicon nitride.

In one embodiment, the dielectric layer comprises a thickness of between 3 and 20 nm based on aluminum oxide, preferably between 3 and 15 nm.

In another embodiment, the dielectric layer furthermore comprises a thickness of between 5 and 15 nm based on silicon nitride, preferably between 8 and 12 nm. When the layer based on silicon nitride is present, the layer based on aluminum oxide may have a thickness of less than or equal to 6 nm, preferably less than or equal to 5 nm.

The invention benefits from a simple and robust method for fabricating integrated circuits having contacts liable to be arranged above gate zones of silicided polysilicon, while being electrically insulated. It is thus possible to create connection terminals straddling between the gate and an active substrate zone, for example a drain or a source, an upper zone of which may also be silicided. The gate may extend longitudinally to above an isolation trench zone, where the area necessary for forming a contact joining with the interconnection levels is greater. It is thus possible to reduce the space between a contact terminal and a polysilicon gate to a distance of the order of 30 to 40 nm, preferably 30 to 35 nm, and to do so with a contact terminal having a diameter of the order of 60 to 90 nm with an inter-gate distance of the order of 80 nm while allowing upper zones of the polysilicon gates to be silicided. The method can be carried out by means of etching masks used for the prior steps of fabricating the integrated circuit, in particular steps of defining shallow isolation trenches and defining gates, generally of polysilicon.

In an embodiment, a method comprises: forming a dielectric layer on a transistor comprising a substrate, at least one active zone formed in the substrate, at least one insulating zone formed in the substrate and a gate, the gate being formed above the active zone and extending over the insulating zone, the dielectric layer covering the gate; etching the dielectric layer so as to leave an insulating portion at least on the gate within the active zone so that the gate at the active zone is electrically insulated from other elements formed above the dielectric layer; and forming a first interconnection terminal above the active zone and partially above the gate, the first interconnection terminal being insulated from the gate by the insulating portion of the dielectric layer within the active zone.

In an embodiment, an integrated circuit comprises: a transistor comprising a substrate, at least one active zone formed in the substrate, at least one insulating zone formed in the substrate, and a gate formed above an active zone and extending over the insulating zone; a dielectric layer covering a portion of the gate within the active zone so that the gate at the active zone is electrically insulated from other elements formed above the dielectric layer; and a first interconnection terminal above the active zone and partially above the gate, the first interconnection terminal being insulated from the gate by the insulating portion of the dielectric layer within the active zone.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
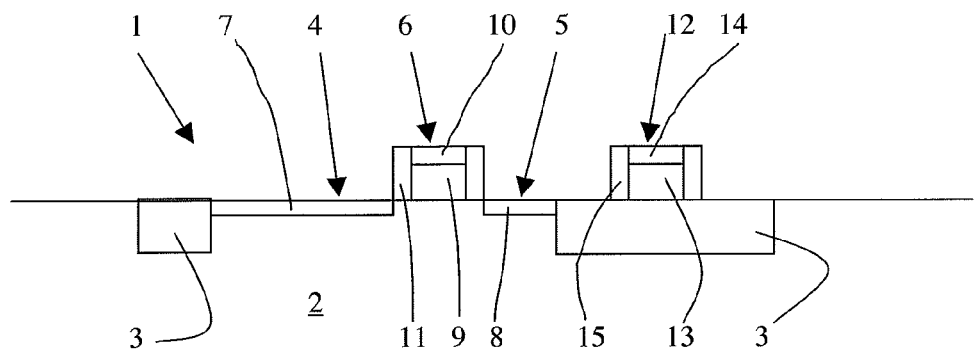
FIG. 1 is a schematic view in section of an integrated circuit during fabrication.

As can be seen in FIG. 1, the integrated circuit referenced 1 in its entirety comprises a substrate 2, for example of silicon, silicon on insulator (generally referred to as SOI) or silicon on nothing (generally referred to as SON). A plurality of shallow isolation trenches 3 (generally referred to as STI) which comprise an insulating material, for example $SiO_2$, are formed in the substrate 2. The integrated circuit 1 comprises a transistor provided with a drain zone 4, a source zone 5 and a gate 6. The drain zone 4 and the source zone 5 have not been represented in detail and respectively comprise a silicided upper part 7 and 8, for example based on $CoSi_2$, ensuring excellent electrical contact with the connection terminals. The gate 6 comprises a lower part 9 based on polysilicon and a silicided upper part 10, for example based on $CoSi_2$. Spacers 11 are arranged on either side of the lower part 9 and upper part 10. The spacers may comprise SiN or SiON.

The integrated circuit 1 also comprises another gate 12, with a structure similar to the gate 6 but arranged above an isolation trench 3 and not above an active zone. The gate 12 comprises a lower part 13, an upper part 14 and spacers 15. The gate 12 may be extended beyond the shallow trench 3 and cooperate with drain and source zones in order to form another transistor (not shown). The fact that the gate 12 is extended over an isolation trench 3 makes it possible to form an interconnection in contact with the upper part 14 of the gate 12, in a zone of the integrated circuit where the density of components is less than in the active zones arranged between two isolation trenches 3.

A dielectric layer 16 which has a substantially constant and relatively small thickness, for example of the order of 30 to 50 angstroms, is subsequently deposited on all of the integrated circuit 1. The dielectric layer 16 may comprise aluminum oxide $Al_2O_3$. The aluminum oxide may be deposited by an atomic layer deposition method, often referred to by the acronym ALD. The dielectric layer 16 covers the substrate 2, the isolation trenches 3, the silicided parts 7, 8 and the gates 6 and 12. The dielectric layer 16 may be etched selectively with respect to the isolation trenches. Aluminum oxide has a good etching selectivity with respect to the $SiO_2$ often used in isolation trenches of the STI type.

Figure 2:
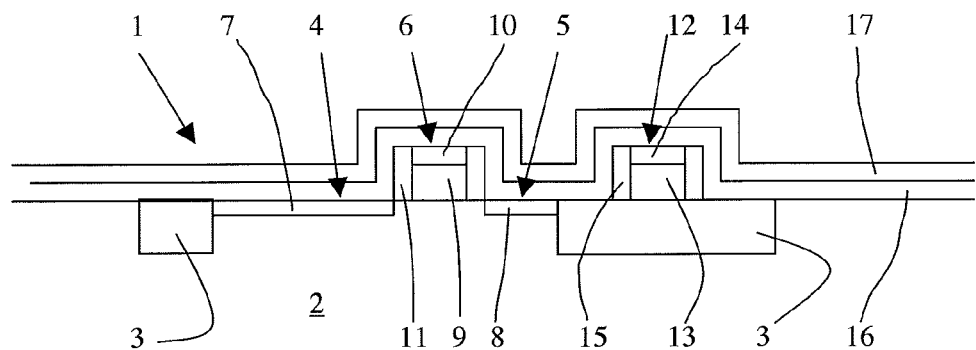
FIGS. 2 to 8 are views which correspond to FIG. 1, illustrating the fabrication steps according to a first embodiment of the invention.

An additional dielectric layer 17 is subsequently deposited conformally on the layer 16. The dielectric layer 17 has a relatively small thickness of the order of 50 to 200 angstroms, preferably between 80 and 120 angstroms. The dielectric layer 17 may comprise silicon nitride. The dielectric layer 17 has an excellent etching selectivity with respect to the dielectric layer 16. The silicon nitride may be etched by dry etching, stopping on the aluminum oxide. The aluminum oxide may be etched by a wet method with dilute hydrofluoric acid stopping on the silicon dioxide, on the silicon of the substrate or on the silicided zones 7 and 8. The integrated circuit 1 is in the state illustrated in FIG. 2.

Figure 3:
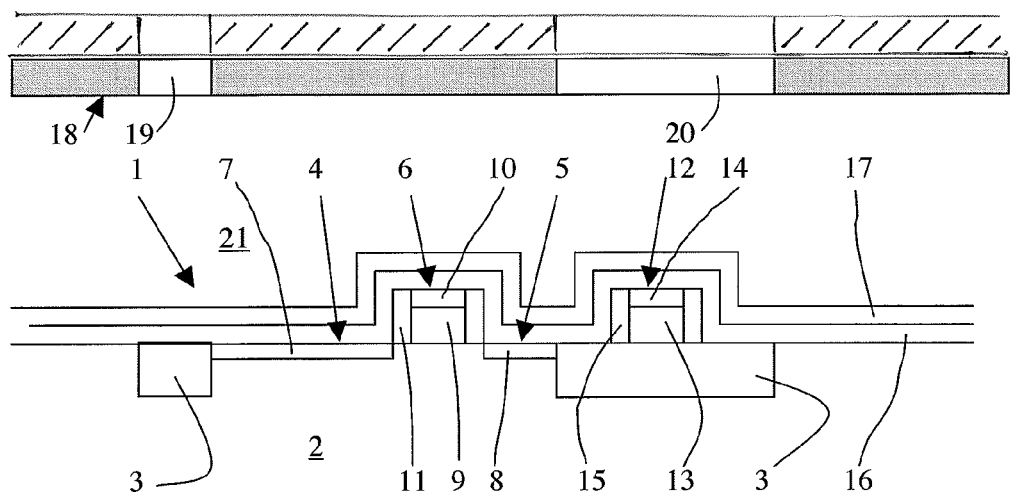

As illustrated in FIG. 3, a filling layer 21 is deposited on the dielectric layer 17, generally over all of the integrated circuit 1. The filling layer 21 has a large thickness, and its purpose is to offer a planar upper surface to facilitate the mask etching steps. The filling layer 21 may be based on amorphous carbon deposited by a chemical vapor method, also known by the acronym CVD. The amorphous carbon may be subjected to anisotropic dry etching. The filling layer 21 may also comprise BARC, an acronym for "bottom anti-reflective coating". This is an organic (carbon-based) layer with a thickness of about 800 Å, which is anti-reflective at the wavelength used by the planarizing lithography step and which is subsequently removed by anisotropic dry etching based on $O_2$.

The upper surface of the filling layer 21 is substantially planar, and a layer of resin 18 is deposited there. The zones 19 and 20 of the resin layer 18 are subsequently exposed by means of a suitable mask. The mask may be the mask which was used to form the isolation trenches 3. The exposed zones 19 and 20 are arranged above the isolation trenches.

All of the resin layer 18 apart from two protected zones 22 and 23 lying vertically above the gates 6 and 12 (see FIG. 4) is then exposed by means of another mask, for example the one used to form the gates 6 and 12. Since the protected zone 23 is entirely contained in the exposed zone 20, the resin lying in the protected zones 23 has nevertheless already experienced prior exposure. Conversely, the protected zone 22 is not exposed either during the first exposure, in so far as the protected zone 22 is offset with respect to the isolation trenches 3, or during the second exposure in which it is specifically protected. The second exposure is preferably weaker than the first, so that the resin lying on the edges of the protected zone 22 remains over a width greater than that provided on the mask, which is equal to that of the gate 6. This makes it possible to maintain a protected zone 22 whose width corresponds substantially to that of the gate 6 and the spacers 11.

Figure 5:
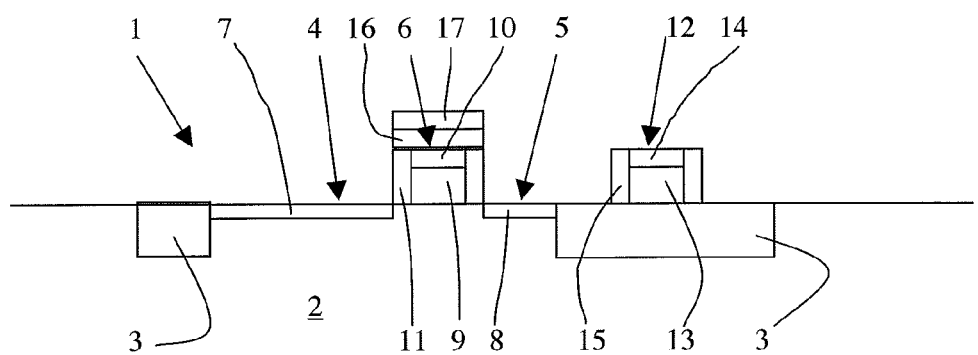

The exposed parts are subsequently developed, the resin being removed in the zones which have experienced single exposure and in the zones which have experienced double exposure. The filling layer 21 is etched, except for the part lying between the protected zone 22 and the gate 6. The dielectric layer 17 is subsequently etched, for example by dry etching stopping on the dielectric layer 16. The rest of the resin layer present in the protected zone 22 and the filling layer 21 lying under the protected zone 22 is removed, for example by an oxygen process. The dielectric layer 16 is subsequently etched, for example by a wet method with dilute hydrofluoric acid stopping on the upper surface of the substrate 2, the isolation trenches 3 and the silicided zones 7 and 8, as well as the gate 12 and the spacers 15. During etching of the dielectric layer 17, the dielectric layer 17 is preserved in line with the protected zone 22, in other words substantially above the gate 6 and the spacers 11. During etching of the dielectric layer 16, the portion of the dielectric layer 16 lying between the remaining portion of the dielectric layer 17, on the one hand, and the gate 6 and the spacers 11, on the other hand, is protected and preserved (see FIG. 5).

Figure 6:
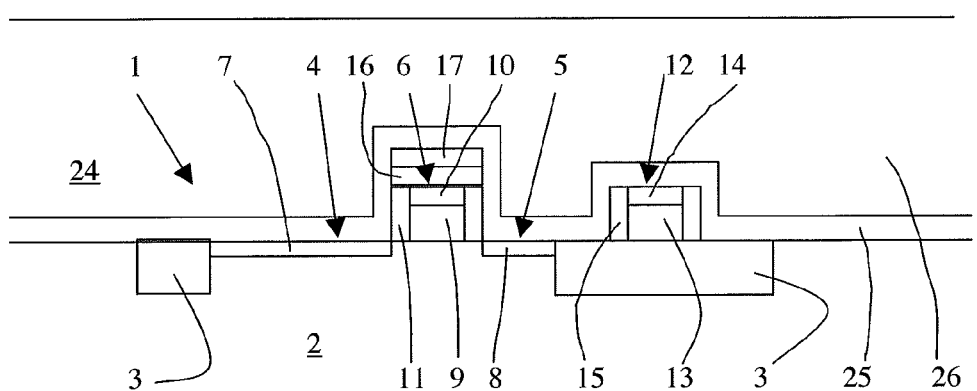
Figure 7:
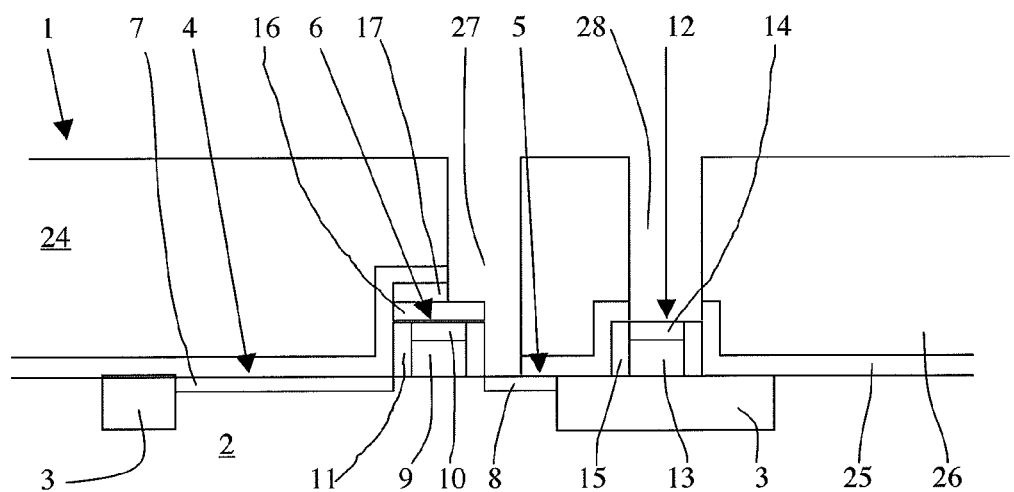

As illustrated in FIG. 6, a thick dielectric layer 24 is subsequently deposited on all of the integrated circuit 1. The thick dielectric layer 24 may comprise a first sublayer 25 referred to as CESL, for example based on silicon nitride, followed by a second sublayer 26 based on $SiO_2$ which is then subjected to planarization by chemical mechanical polishing CMP. The thick dielectric layer 24 is next subjected to anisotropic etching in order to form holes 27 and 28 (see FIG. 7). The hole 27 is formed straddling between the silicided zone 8 and the remaining portion of the dielectric layer 17 above the gate 6. The hole 28 is arranged principally above the silicided upper part 14 of the gate 12 and above a spacer 15. The holes 27 and 28 are formed first by etching the $SiO_2$-based sublayer 26 of the thick dielectric layer 24, then by etching the silicon nitride-based stop sublayer 25 of the thick dielectric layer 24. The hole 27 on the one hand reaches the silicided zone 8 and on the other hand is limited by the dielectric layer 16, which has an excellent etching selectivity with respect to the dielectric layer 17. The hole 28 opens onto the upper surface of the silicided upper part 14 of the gate 12.

Figure 8:
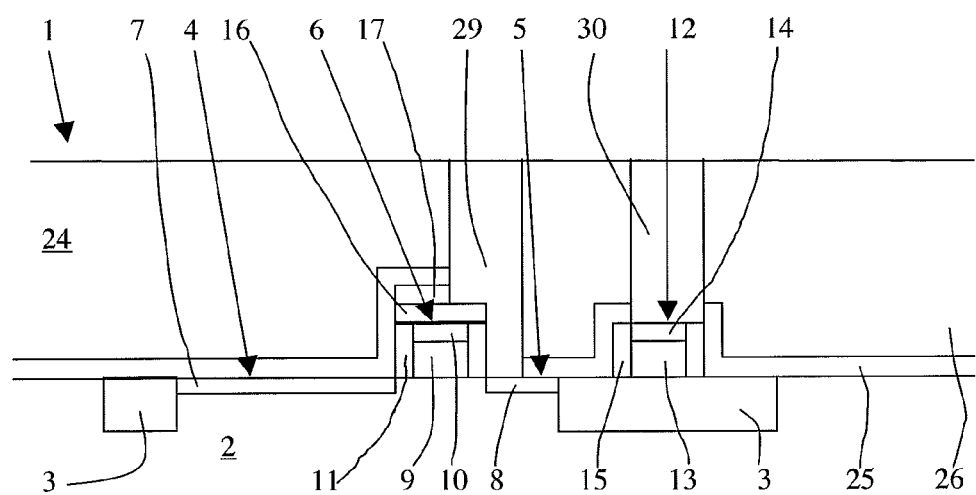

As can be seen in FIG. 8, metal, for example tungsten, is subsequently deposited in the holes 27 and 28, in order to form connection terminals 29 and 30 corresponding respectively to the holes 27 and 28. The terminal 29 is in direct contact with the silicided zone 8, while being insulated from the silicided zone 10 of the gate 6 owing to the presence of the dielectric layer 16. The interconnection terminal 30 is in direct contact with the silicided zone 14 of the gate 12, which gives excellent electrical contact.

By virtue of the invention, it can be seen that expediently using two etching masks previously employed to form the isolation trenches 3 and the gates 6 and 12 makes it possible to form interconnection terminals 29 intended to enter in contact with upper parts of the substrate, while remaining insulated from a neighboring gate 6 arranged above the substrate 2, and interconnection terminals 30 in direct contact with a gate 12 lying above an isolation trench 3. By thus reliably and economically ensuring electrical insulation between an interconnection terminal intended to be connected to a source or a drain and a gate, it is possible to reduce the distance separating an interconnection terminal and a gate and reduce the distance between two gates arranged above active zones of the substrate, which gives a higher integration density making it feasible to fabricate memory cells while occupying a smaller substrate area.

Figure 4:
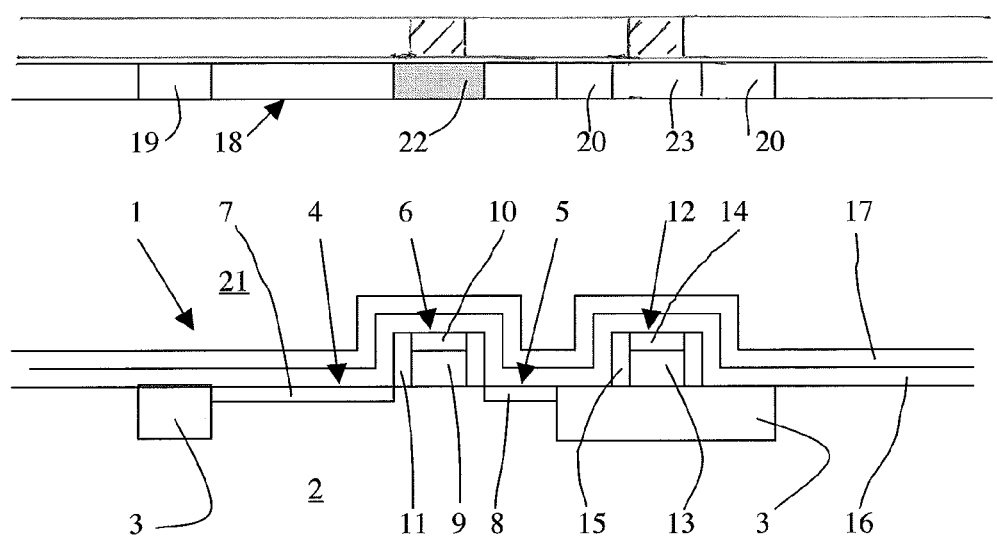

As a variant, it is feasible to replace the two exposure steps respectively illustrated in FIGS. 3 and 4 by a single step, which will employ a mask resulting from mathematical combination of the masks used in the steps of FIGS. 3 and 4. The mask comprises only protected zones 22 corresponding to transistor gates, the gates being arranged above active zones of the substrate 2. The mask can be generated economically by mathematical combination from two existing masks, without being subject to the cost and delay for developing an entirely new mask.

Figure 9:
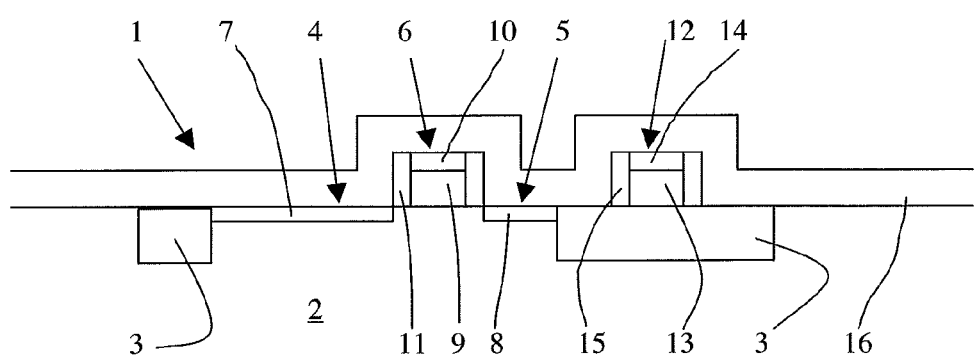
FIGS. 9 to 14 are views which correspond to FIG. 1, illustrating the fabrication steps according to a second embodiment of the invention.

In the embodiment illustrated in FIGS. 9 to 14, the references for similar elements have been retained. As can be seen in FIG. 9, a dielectric layer 16 thicker than in the previous embodiment is deposited on the integrated circuit 1. The thickness of the dielectric layer 16 may lie between 50 and 200 angstroms, preferably between 80 and 150 angstroms. The dielectric layer 16 may comprise aluminum dioxide $Al_2O_3$. Unlike in the previous embodiment, a dielectric layer 17 is not arranged on the dielectric layer 16.

Figure 10:
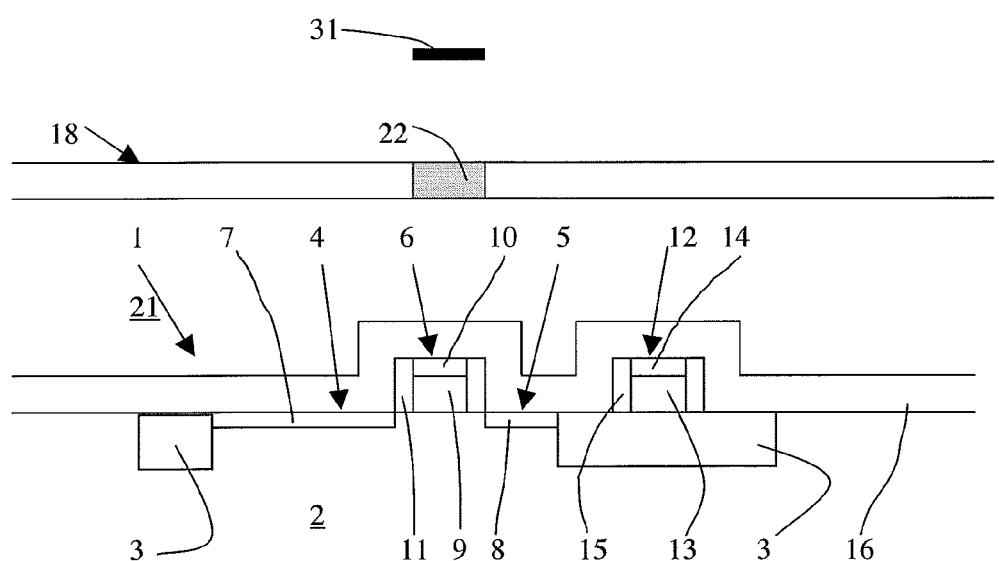
Figure 11:
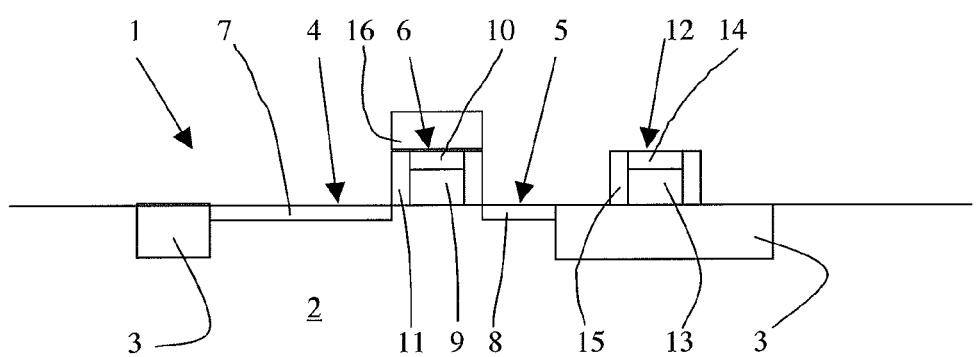
Figure 12:
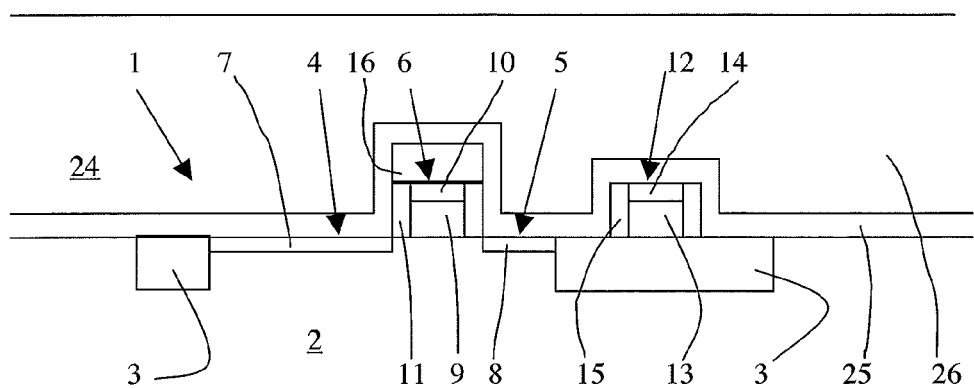

As can be seen in FIG. 10, a filling layer 21 is deposited followed by a layer of resin 18. By means of a mask 31 resulting from mathematical combination of the two masks used in the previous embodiments, single exposure of the resin layer 18 is carried out, a protected portion 22 arranged vertically above the gate 6 remaining unexposed. The exposed resin is subsequently developed, which causes it to disappear except in the protected zone 22. The filling material 21, which may comprise amorphous carbon, is then etched. The etching may be carried out with oxygen and causes removal of the filling layer 21 outside a zone contained between the protected zone 22 and the dielectric layer 16. Anisotropic etching of the dielectric layer 16 is subsequently carried out, which causes it to be removed except in the zone protected by the protected zone 22 and the portion of filling material remaining between the protected zone 22 and the gate. The dielectric layer 16 may be etched by a wet method with dilute hydrofluoric acid. This type of etching is very selective with respect to the silicon of the substrate 2, the silicon oxide of the isolation trenches 3 and the metal silicide of the silicided zones 7 and 8. As can be seen in FIG. 11, this leaves a cap of dielectric material resulting from the etching of the dielectric layer 16 arranged above the gate 6 and the spacers 11.

A bilayer assembly 24 is subsequently deposited comprising a first stop layer 25, for example based on silicon nitride, and a second dielectric layer 26, for example based on silicon oxide and having a large thickness, making it possible to obtain a planar upper surface on the basis of which etching steps can be carried out easily.

Figure 13:
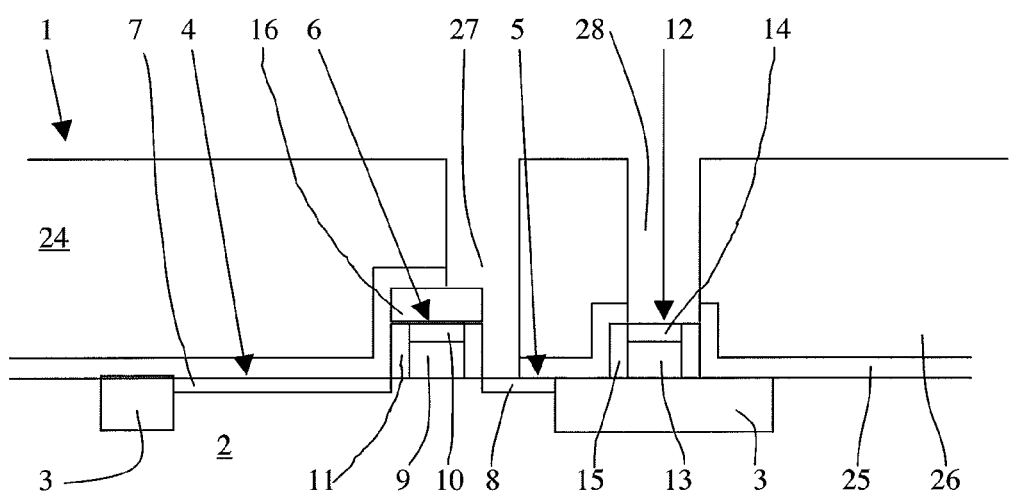

Anisotropic etching of the dielectric layers 26 is first carried out selectively with respect to the stop layer 25, followed by selective anisotropic etching of the stop layer 25 with respect to the dielectric layer 16 and with respect to the silicided upper part 14 of the gate 12 and with respect to the silicided zone 8 (see FIG. 13). The holes 27 and 28 thus formed through the bilayer assembly 24 are subsequently filled with a metal species, for example tungsten, in order to form connectors.

Figure 14:
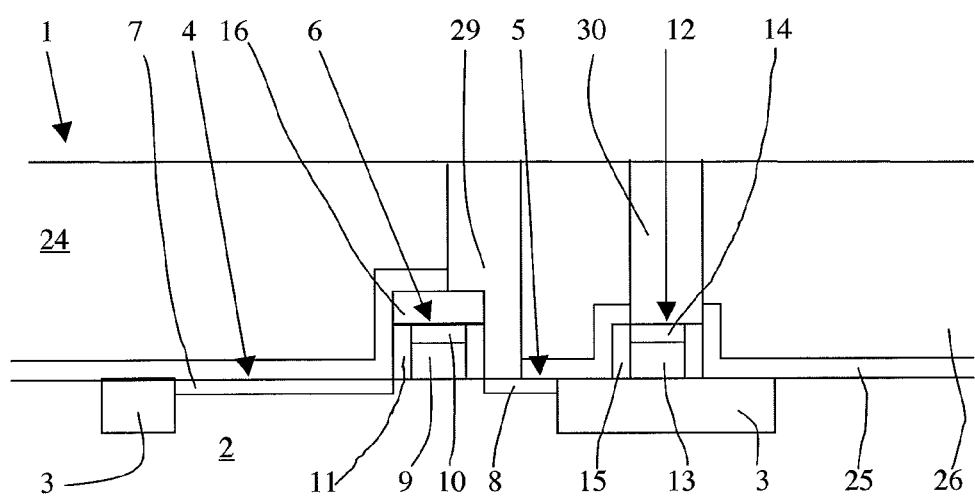

As can be seen in FIG. 14, the connectors 29 and 30 formed in the holes 27 and 28 of FIG. 13 fill the holes. The connector 29 is insulated from the silicided upper part 10 of the gate 6 by virtue of the cap formed by the dielectric layer 16, while being in electrical contact with the silicided zone 8. The connector 30 is in direct contact with the silicided upper part 14 of the gate 12.

As a variant, the first embodiment may be carried out with a single mask resulting from mathematical combination of the mask used to define the isolation trenches and the mask used to define the gates, or the second embodiment may be performed by employing the two masks successively.

The method is very suitable for economical fabrication of integrated circuits, in particular memory cells with a very high density, while very greatly reducing the risk of short-circuit between the contact and a gate arranged on an active zone. By virtue of its design, the method ensures that a gate arranged above an isolation trench can be connected to a contact terminal, which proves desirable in so far as the occupancy of the integrated circuit is much less above the isolation trenches, and also ensures that a gate arranged above an active zone is insulated from the connection terminals, which makes it possible to use terminals reliably for connection to a transistor drain or source in a zone where the occupancy of the integrated circuit is generally very high. The gate 6 illustrated in the figures may of course be extended transversely to the section plane until it arrives above an isolation trench, and connected at this positioned to a connection terminal making it possible to control the corresponding transistor or transistors.

The method for fabricating an integrated circuit makes it possible to produce a gate insulated from an interconnection terminal formed in proximity and connected to an upper substrate surface above an active zone. To this end, a dielectric layer is formed above the upper part of the gate and optionally above the spacer next to the gate. The dielectric layer is formed on all of the integrated circuit, then etched by using the masks previously employed to fabricate the gate and to fabricate the insulating zone.

The integrated circuit may comprise a substrate in which at least one active zone and at least one insulating zone, for example a shallow isolation trench, is formed. A gate is formed above an active zone of the substrate. A dielectric layer comprising aluminum oxide is arranged above the upper part of the gate while being slightly wider, in so far as this is possible. The gate is thus electrically insulated from other elements formed in the vicinity of the dielectric layer, for example a connection terminal connected to the active zone but liable to partially overlap the gate in view of the fabrication tolerances.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit, comprising:
   a first transistor formed in a substrate and provided with at least one insulating zone in the substrate, the first transistor comprising at least one active zone formed in the substrate and a first gate terminal, the first gate terminal being formed above the at least one active zone;
   a dielectric layer comprising aluminum oxide covering at least the first gate terminal, so that the first gate terminal is electrically insulated from other elements formed above the dielectric layer; and
   a second gate terminal for a second transistor, the second gate terminal being formed above the at least one insulating zone in the substrate, wherein the dielectric layer comprising aluminum oxide covering the first gate terminal has been removed so as to completely uncover from edge to edge on a top surface of the second gate terminal above the at least one insulating zone.

2. The circuit according to claim 1, wherein the dielectric layer comprises an aluminum oxide layer having a thickness of between 3 and 15 nm.

3. The circuit according to claim 2, wherein the dielectric layer further comprises a silicon nitride layer having a thickness of between 5 and 15 nm.

4. The circuit according to claim 3, wherein the silicon nitride layer overlies the aluminum oxide layer.

5. The circuit according to claim 1, wherein the dielectric layer comprising aluminum oxide has been removed by etching through a mask defined at least in part by a mask used to define the at least one insulating zone in the substrate.

6. The circuit according to claim 5, wherein the at least one insulating zone in the substrate comprises a shallow trench isolation, and wherein the mask used to define the at least one insulating zone in the substrate comprises a shallow trench isolation mask.

7. The circuit according to claim 1, further comprising a source region and a drain region for the first transistor in the active region, a sidewall spacer on a side of the first gate terminal, and a first interconnection terminal above the active zone and at least partially above the first gate terminal extending to make electrical contact with one of the source region or drain region, the first interconnection terminal being in contact with the dielectric layer above the first gate terminal and the sidewall spacer on the side of the first gate terminal so as to be insulated from the first gate terminal in the active zone.

8. The circuit according to claim 7, further comprising a second interconnection terminal above both the second gate terminal and the at least one insulating zone in the substrate, wherein the second interconnection terminal makes electrical contact with the second gate terminal.

9. The circuit according to claim 1, further comprising a source region and a drain region for the first transistor in the active region, a sidewall spacer on a side of the first gate terminal, a contact opening above the active zone which laterally extends over at least part of the first gate terminal, the sidewall spacer and at least part of one of the source region or drain region, and a first interconnection terminal in said contact opening extending to make electrical contact with said one of the source region or drain region.

10. The circuit according to claim 1, further comprising a source region and a drain region for the first transistor in the active region, a sidewall spacer on a side of the first gate terminal, a further dielectric layer covering the first transistor in the active region, said further dielectric layer having a planar top surface and a non-planar bottom surface, and an interconnection terminal extending through said further dielectric layer to make electrical contact with one of the source region or drain region, said interconnection terminal laterally extending in the further dielectric layer at least partially over said first gate terminal.

11. An integrated circuit, comprising:
a transistor comprising a substrate, at least one active zone formed in the substrate including a source region and drain region, at least one insulating zone formed in the substrate, and a gate terminal including a first portion formed above the at least one active zone and a second portion extending over the insulating zone, and insulating sidewall spacer on a side of the gate terminal;
a dielectric layer covering the first portion of the gate terminal above the active zone so that the first portion of the gate terminal above the active zone is electrically insulated from other elements formed above the dielectric layer, the dielectric layer having been removed so as to uncover the second portion of the gate terminal above the at least one insulating zone; and
a first interconnection terminal above the active zone and partially above the gate terminal extending to make electrical contact with one of the source region or drain region, the first interconnection terminal laterally extending over the first portion of the gate terminal, the sidewall spacer and one of said source region or drain region and being insulated from the first portion of the gate terminal by the dielectric layer and sidewall spacer above the active zone.

12. The circuit of claim 11, further comprising a second interconnection terminal above the at least one insulating zone and in electrical contact with the gate terminal.

13. The circuit of claim 11, wherein the dielectric layer has been removed by etching through a mask defined at least in part by a mask used to define the at least one insulating zone in the substrate.

14. The circuit of claim 13, wherein the at least one insulating zone in the substrate comprises a shallow trench isolation, and wherein the mask used to define the at least one insulating zone in the substrate comprises a shallow trench isolation mask.

15. The circuit of claim 11, wherein the dielectric layer comprises a thickness aluminum oxide over the gate terminal in the active zone and not over the gate terminal above the at least one insulating zone.

16. The circuit of claim 15, wherein the dielectric layer comprises an aluminum oxide layer having a thickness of between 3 and 15 nm.

17. The circuit of claim 16, wherein the dielectric layer further comprises a silicon nitride layer having a thickness of between 5 and 15 nm.

18. The circuit of claim 17, wherein the silicon nitride layer overlies the aluminum oxide layer.

19. An integrated circuit, comprising:
a substrate;
an isolation structure in the substrate which defines an active region;
a source region in the active region;
a drain region in the active region;
a gate dielectric on top of the substrate in the active region;
a gate terminal over the gate dielectric in the active region and which extends over the isolation structure;
a first dielectric layer on top of the gate terminal;
a second dielectric layer which covers the first dielectric layer and sidewall spacers in the active region and which further covers the isolation structure and which further has a planar top surface and a non-planar bottom surface;
a first contact opening in the first and second dielectric layers above the isolation structure which exposes a top of the gate terminal where the gate terminal extends over the isolation structure;
a second contact opening in the second dielectric layer, wherein said second contact opening laterally extends in the second dielectric layer at least partially over the gate terminal and at least partially over one of the source region or drain region so as to expose an upper surface of said one of the source region or drain region;
a first electrical contact within the first contact opening configured to make an electrical connection to the gate terminal; and
a second electrical contact within the second contact opening configured to make an electrical connection to the upper surface of said one of the source region or drain region and be insulated from said gate terminal by at least said first dielectric layer on top of the gate terminal.

20. The circuit of claim 19, wherein the lateral extension of said second contact opening exposes the first dielectric layer on top of the gate terminal, and wherein the second electrical contact in the second contact opening is in contact with the first dielectric layer on top of the gate terminal.

* * * * *